US006881619B1

(12) United States Patent
Lee et al.

(10) Patent No.: US 6,881,619 B1
(45) Date of Patent: Apr. 19, 2005

(54) METHOD FOR FABRICATING A NON-VOLATILE MEMORY AND METAL INTERCONNECT PROCESS

(75) Inventors: Ming-Tung Lee, Hsinchu (TW); Chao-Ching Lin, Hsinchu (TW)

(73) Assignee: Macronix International Co., Hsinchu (TW)

( * ) Notice: Subject to any disclaimer, the term of this patent is extended or adjusted under 35 U.S.C. 154(b) by 0 days.

(21) Appl. No.: 10/707,707

(22) Filed: Jan. 6, 2004

(30) Foreign Application Priority Data

Dec. 23, 2003 (TW) ...................................... 92136489 A

(51) Int. Cl.[7] ................. H01L 21/8238; H01L 21/8234
(52) U.S. Cl. ...................... 438/216; 438/261; 438/265; 438/275; 438/287; 438/786; 438/791; 438/954
(58) Field of Search ............................... 438/216, 261, 438/265, 275–278, 287, 954, 786, 791

(56) References Cited

U.S. PATENT DOCUMENTS

| | | | | |
|---|---|---|---|---|
| 5,910,453 A | * | 6/1999 | Gupta et al. ................. | 438/717 |
| 6,674,132 B1 | * | 1/2004 | Willer ......................... | 257/390 |
| 6,743,681 B1 | * | 6/2004 | Bhattacharyya ............. | 438/287 |
| 2003/0032224 A1 | * | 2/2003 | Sung et al. .................. | 438/197 |
| 2004/0094793 A1 | * | 5/2004 | Noguchi et al. ............. | 257/315 |

OTHER PUBLICATIONS

Wolf, Ph.D., Stanley, Richard N. Tauber, Ph.D., "Chemical Vapo Deposition of Amorphous and Polycrystalline Films," Silicon Processing for the VLSI Era—vol. 1: Process Technology, Lattice Press, 1986, pp. 183–185.*

Wolf, Ph.D., Stanley, Richard N. Tauber, Ph.D., "Thermal Oxidation of Single Crystal Silicon," Silicon Processing for the VLSI Era—vol. 1: Process Technology, Lattice Press, 1986, p. 198.*

Wolf, Ph.D., Stanley, Richard N. Tauber, Ph.D., "Lithography I: Optical Resist Materials and Process Technology," Silicon Processing for the VLSI Era—vol. 1: Process Technology, Lattice Press, 1986, p. 438.*

Wolf, Ph.D., Stanley, "Multilevel–Interconnect technology for VLSI and ULSI," Silicon Processing for the VLSI Era—vol. 2: Process Integration, Lattice Press, 1990, pp. 273.*

* cited by examiner

*Primary Examiner*—Mary Wilczewski
*Assistant Examiner*—Toniae M. Thomas
(74) *Attorney, Agent, or Firm*—Jiang Chyun IP Office

(57) ABSTRACT

A method for fabricating a non-volatile memory is provided. A stacked structure including a tunneling layer, a trapping layer, a barrier layer, and a control gate is formed on a substrate. A source region and a drain region are formed beside the stacked structure in the substrate. A silicon oxide spacer is formed on the sidewalls of the stacked structure. An ultraviolet-resistant lining layer is formed on the surfaces of the substrate and the stacked structure to prevent the ultraviolet light from penetrating into the trapping layer. A dielectric layer is formed on the ultraviolet-resistant lining layer. A contact being electrically connected to the control gate is formed in the dielectric layer. A conducting line electrically connected to the contact is formed on the dielectric layer. A lost-surface-charge lining layer is formed on the surfaces of the dielectric layer and the conducting line to reduce the antenna effect.

22 Claims, 7 Drawing Sheets

METHOD FOR FABRICATING A NON-VOLATILE MEMORY AND METAL INTERCONNECT PROCESS

CROSS-REFERENCE TO RELATED APPLICATIONS

This application claims the priority benefit of Taiwan application serial no. 92136489, filed Dec. 23, 2003.

BACKGROUND OF INVENTION

1. Field of the Invention

This invention generally relates to a method for fabricating a semiconductor device, and more particularly to a method for fabricating a non-volatile memory and a metal interconnect process.

2. Description of Related Art

Non-volatile memory devices have been used to store data. Flash memory is one type of the non-volatile memory devices, which is an electrically erasable programmable read only memory (EEPROM) in which data is retained even after all power sources have been disconnected. Flash memory has been widely used in personal computers and other electronic equipment because it can provide the property of multiple entries, retrievals and erasures of data.

A conventional flash memory cell is a transistor with a control gate, a doped polysilicon floating gate and an oxide layer separating these two gates from each other. A tunneling oxide layer separates the floating gate and the substrate. During the programming of the memory, proper biases are applied to the source region, the drain region and the control gate. Electrons would then travel from the source region to the drain region through the channel. During this process, some of the electrons are injected through the tunneling oxide layer into the polysilicon floating gate, and the electrons are evenly distributed in the entire polysilicon floating gate. The injection of electrons into the polysilicon floating gate is known as the tunneling effect. The operation mechanism of a flash memory device includes the channel hot electron injection for programming of data and the Fowler-Nordheim Tunneling for the erasing of data. However, if defects are present in the tunneling oxide layer underneath the polysilicon floating gate, current leakage easily occurs, which affects the reliability of the memory device.

To prevent the flash memory from the current leakage problem, a charge-trapping layer has been proposed to replace the polysilicon floating gate, and the EEPROM is formed with a stacked gate structure comprising a silicon oxide/silicon nitride/silicon oxide (ONO) composite layer. The material of the charge-trapping layer is silicon nitride. Hence, this kind of EEPROM is also called silicon nitride read only memory (NROM). Because the silicon nitride layer can trap charges, the injected electrons will not be distributed uniformly in the silicon nitride layer but Gaussian-distributed in the silicon nitride layer. Therefore, the current leakage will be reduced because most of the electrons are localized in small section of the silicon nitride layer, and thus they are insensitive to the defect of the tunneling oxide layer.

Another advantage of using silicon nitride layer is that during the programming process the electrons are stored locally in the channel, close to the source side or the drain side. Hence, during the programming process, the voltage can be applied to the source region and the control gate in one end of the stacked gate, and the Gaussian-distributed electrons are stored in the silicon nitride layer at the drain region in the other end of the stacked gate. The voltage can also be applied to the drain region and the control gate in one end of the stacked gate, and the Gaussian-distributed electrons are stored in the silicon nitride layer at the source region in the other end of the stacked gate. Therefore, by changing the voltages applied to the control gates and the above two regions, there may be two groups of Gaussian-distributed electrons, one group of Gaussian-distributed electrons, or no electrons in a single silicon nitride layer. Hence, the flash memory using a silicon nitride layer to replace the floating gate can be programmed in four states, and such a memory cell is a two bits in one cell flash memory cell.

However, during the fabrication of the NROM, for example, in the PECVD process, the plasma causes the charges to move along the metal, which induces the so-called antenna effect. Hence, in a brief moment, a portion of electrons is trapped in the composite ONO layer such that a wide threshold voltage distribution among memory devices is resulted.

It should be noted that in addition to the antenna effect that leads to a wide threshold voltage distribution, the clustering of the electrons on the surface of the film may result, For example, during the metal interconnect process of the NROM, an insulating layer is formed by the PECVD process to cover the metal lines. The material of the insulating layer is oxide or nitride. However, the plasma used in the PECVD process often causes a clustering of charges on the surface of the insulator layer. These charges then move to the silicon nitride layer in the ONO layer along the metal lines. As a result, a wide threshold voltage distribution among memory devices is resulted.

Further, during the photolithography process, an ultraviolet light is used for exposure. However, in a NROM device, electron-hole pairs are generated in the silicon nitride layer as the silicon nitride layer of the ONO layer being irradiated by the ultraviolet light. Further, because the holes are easily slipped away and only the electrons are left in the silicon nitride layer. Ultimately, a wide threshold voltage distribution among memory devices is resulted.

SUMMARY OF INVENTION

An object of the present invention is to provide a method for fabricating a non-volatile memory, wherein the antenna effect is mitigated to thereby prevent a wide threshold voltage distribution among memory devices.

Another object of the present invention is to provide a method for fabricating a non-volatile memory to prevent the silicon nitride layer of the ONO layer from being exposed to the ultraviolet light, and the clustering of electrons in the silicon nitride layer.

Still another object of the present invention is to provide a metal interconnect process to reduce the amount of electrons clustering on the surface of the insolating layer formed by the PECVD process.

The present invention provides a method for fabricating a non-volatile memory, comprising first sequentially forming a tunneling layer, a trapping layer, a barrier layer, a gate conductive layer, and an anti-reflection layer on a substrate. Then, a photoresist layer with a pattern is formed the anti-reflection layer. The photoresist layer is used as an etching mask to pattern the anti-reflection layer, the gate conductive layer, the barrier layer, the trapping layer, and the tunneling layer, so as to form a stacked structure having the gate conductive layer, the barrier layer, the trapping layer, and the tunneling layer. This stacked structure is covered by the anti-reflection layer.

After removing the photoresist layer, a thin oxide layer is formed on the exposed surface of a control gate at the sidewalls. An insulating spacer is formed on each side sidewall of the stacked structure and covers the thin oxide layer. Then, a lining layer, which is used to resist ultraviolet light, is formed over the stacked structure, so as to prevent the ultraviolet light from entering to the trapping layer, and the causing charge accumulation on the trapping layer.

The present invention provides a fabrication process for metal interconnects, comprising: providing a substrate, the substrate having a conducting structure; forming a dielectric layer on the substrate to cover the conducting structure; forming a contact window in the dielectric layer, the contact window being electrically connected to the conducting structure; forming a conducting line structure on the dielectric layer, the conducting line structure being electrically connected to the contact window; and forming a low surface charge lining layer on the surfaces of the dielectric layer and the conducting line structure.

The present invention provides a method for fabricating a non-volatile memory, comprising first sequentially forming a tunneling layer, a trapping layer, a barrier layer, a gate conductive layer, and an anti-reflection layer on a substrate. Then, a photoresist layer with a pattern is formed the anti-reflection layer. The photoresist layer is used as an etching mask to pattern the anti-reflection layer, the gate conductive layer, the barrier layer, the trapping layer, and the tunneling layer, so as to form a stacked structure having the gate conductive layer, the barrier layer, the trapping layer, and the tunneling layer. Wherein, the anti-reflection layer covers on top.

Then, after removing the photoresists layer, a thin oxide layer is formed in the exposed surface of the control gate. A spacer is formed on each sidewall of the stacked structure and also covers the thin oxide layer. Then, an ultraviolet-resistant lining layer is formed over the stacked structure, so as to prevent the ultraviolet light from entering to the trapping layer, and the causing charge accumulation on the trapping layer. A dielectric layer is formed on the ultraviolet-resistant lining layer. A contact window is formed in the dielectric layer, the contact window being electrically connected to the control gate. A conducting line structure is formed on the dielectric layer, the conducting line structure being electrically connected to the contact window. A lining layer with low surface charges is formed on the surfaces of the dielectric layer and the conducting line structure.

In brief, the present invention, after forming the insulating spacer on the sidewall of the stacked structure, an ultraviolet-resistant lining layer is formed on the insulating spacer and the surface of the substrate to prevent the ultraviolet light from penetrating into the trapping layer, thereby reducing the amount of electrons in the trapping layer. Further, the present invention can change the parameter of the PECVD process to form a low surface charge lining layer, thereby reducing the antenna effect.

It is to be understood that both the foregoing general description and the following detailed description are exemplary, and are intended to provide further explanation of the invention as claimed.

DETAILED DESCRIPTION

Figure 1A:
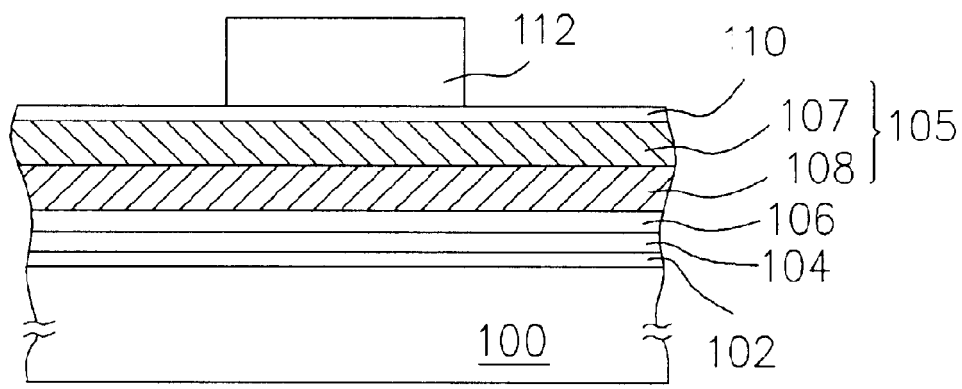
FIGS. 1A–1G are cross-sectional views showing the progression of steps for fabricating a non-volatile memory in accordance with an embodiment of the present invention.

FIGS. 1A–1G are cross-sectional views showing the progression of steps for fabricating a non-volatile memory in accordance with an embodiment of the present invention. Referring to FIG. 1A, a tunneling layer 102, a trapping layer 104 and barrier layer 106 are sequentially formed on a substrate 102. The material of the substrate 100 is, for example, silicon; the barrier layer 102 is, for example, a silicon oxide layer. The trapping layer 104 is, for example, a silicon nitride layer. The barrier layer 106 is, for example, a silicon oxide layer.

A polysilicon layer 108 and a metal silicide layer 107 are sequentially formed on the barrier layer 106, wherein the polysilicon layer 108 and the metal silicide layer 107 form a gate conductive layer 105. An anti-reflection layer 110 is formed on the gate conductive layer 105. Wherein, the polysilicon layer 108 is formed by a method including, for example, a chemical vapor deposition. The metal silicide layer is formed by a method including, for example, forming a metal layer on the polysilicon layer 108, and performing a thermal process to cause a reaction between the metal layer and the polysilicon layer 108, so as to form the metal silicide layer 107. A photoresist layer 112 with a pattern is formed on the anti-reflection layer 110 by the photolithographic processes.

Figure 1B:
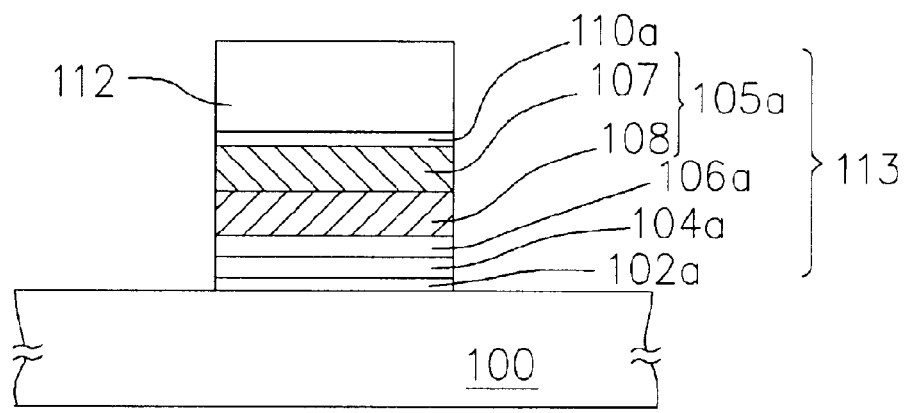

Referring to FIG. 1B, using the photoresist layer as the etching mask to perform etching process, the tunneling layer 102, the trapping layer 104, the barrier layer 106, the gate conductive layer 105, and the antireflection layer 110 are patterned to form a stacked structure 113, which includes the tunneling layer 102a, the trapping layer 104a, the barrier layer 106a (oxide/nitride/oxide composite layer), and the gate conductive layer 105a. The stacked structure 113 is covered by the anti-reflection layer 110a.

In the foregoing photolithographic process on the photoresist layer, the anti-reflection layer 110 can absorb light, so that the exposing light source is prevented from an interference between the incident light and the reflected light from the substrate or the film layer. Also and, the anti-reflection layer 110 includes, for example, organic or inorganic dielectric materials. If the anti-reflection layer 110 includes the inorganic dielectric material, the fabrication processes are described as follows.

Figure 1C:
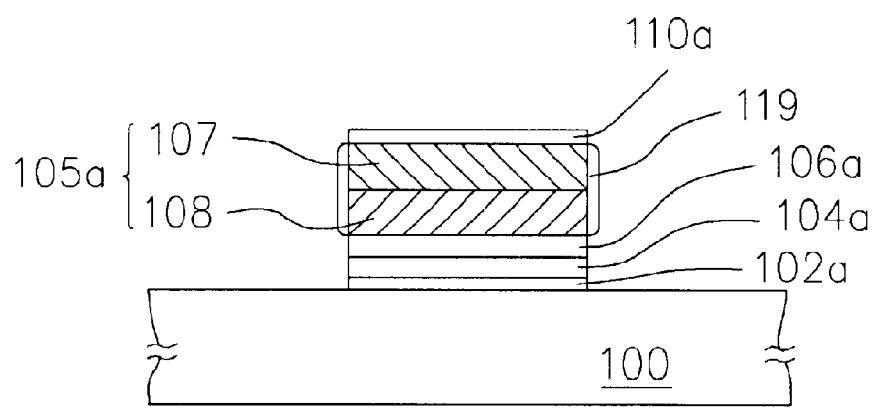

In FIG. 1C, after the photoresist layer 112 is removed, since the anti-reflection layer 110a includes the inorganic dielectric material, the anti-reflection layer 110a is not removed while removing photoresist layer 112. Then, the exposed surface of the control gate 105a, that is, the surface at the sidewalls of the control gate 105a, is formed with a thin oxide layer 119. In one embodiment, the thin oxide layer 119 is formed, for example, by a thermal oxidation process, wherein the oxygen and nitrogen gases are flowed through. Here, the thin oxide layer 119 and the anti-reflection layer 110a can be used to protect the control gate 105a form being damaged by the subsequent fabrication process.

Figure 1D:
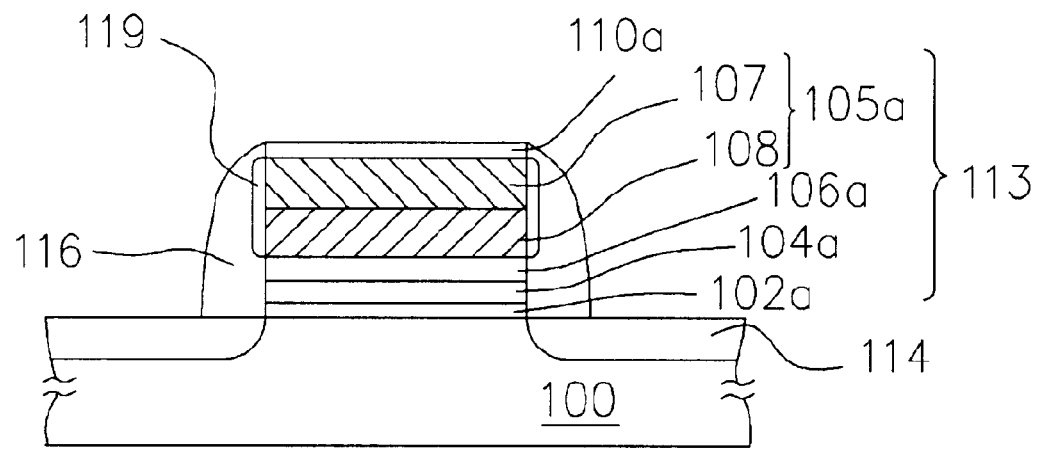

In FIG. 1D, a source/drain region 114 is formed in the substrate 10 at each side of the control gate 105a. An insulating spacer 116 is formed on each side of the stacked structure 113. The spacer 116 can be formed by, for example, forming a dielectric layer (not shown) over the substrate 100 by, for example, chemical vapor deposition (CVD), and performing an etching back process on the dielectric layer, so as to form the spacer 116. The dielectric layer includes, for example, silicon oxide.

Figure 1E:
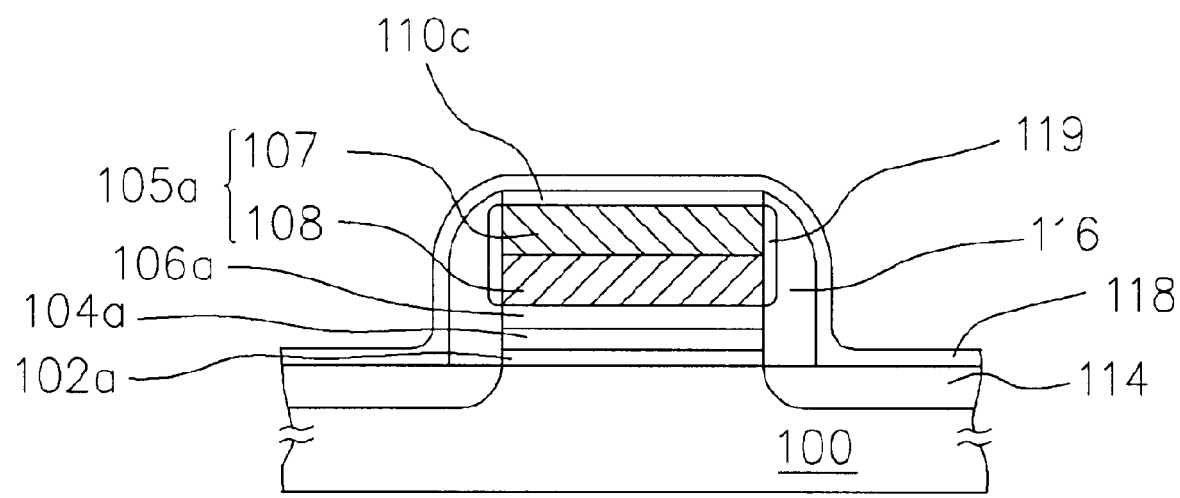
Figure 1F:
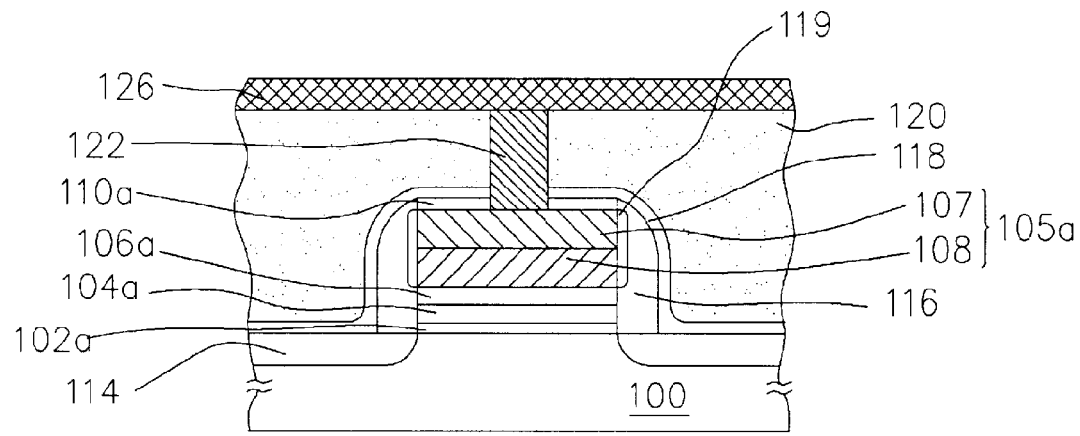

Referring to FIG. 1E, a plasma enhanced CVD (PECVD) is performed to form an ultraviolet-resistant lining layer 118 on the surfaces of the substrate 100 and the spacer 116. In a preferred embodiment of the present invention, the material of the ultraviolet-resistant lining layer 118 is silicon nitride, for example. The process parameters for forming the ultraviolet-resistant lining layer 118 are as follows. The reacting gas includes a silane ($SiH_4$) gas with a flow rate between 50 sccm and 60 sccm, preferably 55 sccm, an ammonia ($NH_3$) gas with a flow rate between 20 sccm and 30 sccm, preferably 25 sccm, and a nitrogen ($N_2$) gas with a flow rate between 2600 sccm and 3000 sccm, preferably 2800 sccm. The temperature for the PECVD process is between 380° C. and 420° C., preferably 400° C.; the power for the PECVD process is between 370W and 410W, preferably 390W; the pressure for the PECVD process is between 7.0 torr and 8.0 torr, preferably 7.5 torr. The thickness of the film is between 180 Å and 220 Å, preferably 200 Å. It should be noted that the flow rates of $SiH_4$ and $NH_3$ and the applied power are smaller than those in the conventional method. Hence, the thin film formed under those parameters is much denser because of a lower deposition rate.

Taking the ultraviolet-resistant lining layer 118 as an example, the deposition rate for the ultraviolet-resistant lining layer 118 of the present invention is 680 Å per minute, which is much lower than the conventional deposition rate 7000 Å per minute. Hence, the ultraviolet-resistant lining layer 118 formed under those parameters is much denser. Therefore, during the subsequent photolithography process, the ultraviolet-resistant lining layer 118 can effectively prevent the ultraviolet light from penetrating into the trapping layer 104 so that the unwanted clustering charges in the trapping layer 104a is prevented. Further, even if the charges may be clustered in the ultraviolet-resistant lining layer 118 due to the exposure to the ultraviolet light, the trapping layer 104a is not affected because there is an insulating spacer 116a between the ultraviolet-resistant lining layer 118 and the trapping layer 104a.

In another preferred embodiment of the present invention, a metal interconnect process is performed subsequent to the process step as shown in FIG. 1E. First, in FIG. 1F, an inter-layer dielectric (ILD) material 120 is formed on the ultraviolet-resistant lining layer 118. Then, a contact 122 is formed in the inter-layer dielectric material 120 through the ultraviolet-resistant lining layer 118 and the patterned anti-reflection layer 110a. Thereafter, a metal layer 26 is formed on the dielectric layer 120 and the contact 122.

Figure 1G:
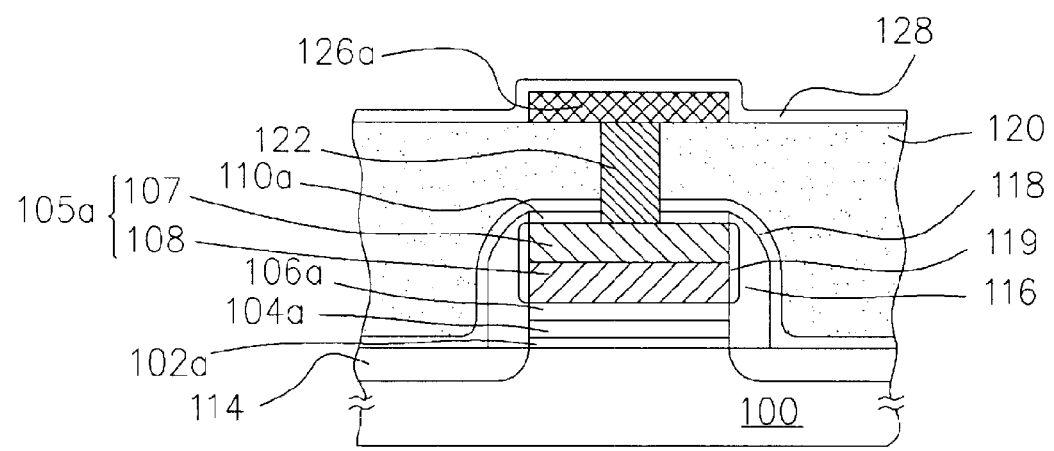

Referring to FIG. 1G, photolithography and etching processes are performed to pattern the metal layer 126 to form a conducting line structure 126a. The conducting line structure 126a is electrically connected to the control gate 105a via the contact window 122. Then, the PECVD process is performed to form a low surface charge lining layer 128 on the surfaces of the conducting line structure 126a and the inter-layer dielectric material 120. The material of the low surface charge lining layer 128 can be silicon oxide or silicon nitride. Taking silicon oxide as an example, the process parameters for forming the low surface charge lining layer 128 are as follows. The reacting gas includes $SiH_4$ with a flow rate between 20 sccm and 30 sccm, preferably 25 sccm, and $N_2O$ with a flow rate between 750 sccm and 1000 sccm, preferably 900 sccm. The temperature for the PECVD process is between 380° C. and 420° C., preferably 400° C. The power for the PECVD process is between 370W and 410W, preferably 390W. The pressure for the PECVD process is between 2.0 torr and 3.0 torr, preferably 2.5 torr. The thickness of the film is between 900 Å and 3300 Å, preferably about 2000 Å. It should be noted that the flow rate of $SiH_4$ and the applied power are smaller than those of the conventional method. Hence, the thin film formed under those parameters is much denser because of a lower deposition rate. For example, the deposition rate is reduced from 12000 Å per minute to 3800 Å per minute.

It should be noted that when the film is formed by the PECVD process, the accumulated charges and the charge distribution depend on the reacting gas and the power applied in the process. In the conventional PECVD process, the power applied to form a silicon oxide layer is 185W and the flow rate of $SiH_4$ is 90 sccm. However, in the embodiments of the present invention, the power and the flow rate of $SiH_4$ is much lower than those in the convention PECVD. Hence, the parameters in the embodiments of the present invention can reduce the charges being clustered on the surface of the lining layer 128, thereby reducing the antenna effect. Further, if the material of the low surface charge lining layer 128 is, for example, silicon nitride, the low surface charge lining layer 128 can also prevent the penetration of moisture into the device.

In the embodiment, the amount of charges in the low surface charge lining layer 128 are determined by measuring the work functions of the low surface charge lining layer 128 and the substrate 100. If there is a big difference between those two work functions, it is an indication that there are more charges in the low surface charge lining layer 128, and vice versa. By measuring the work functions, whether the low surface charge lining layer 128 meets the low surface charge requirement can be determined.

Figure 2A:
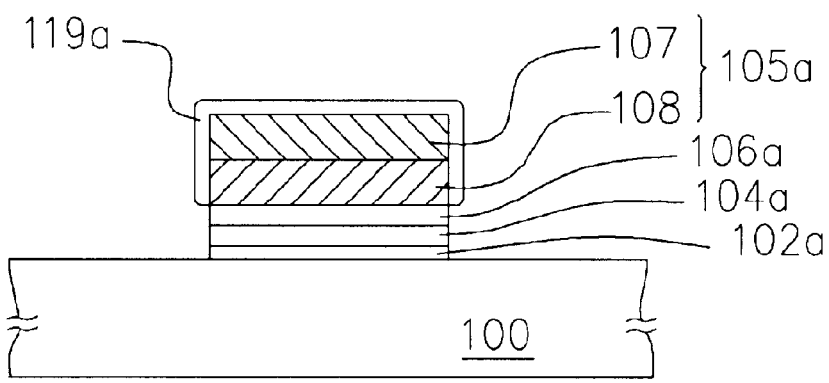
FIGS. 2A–2E are cross-sectional views showing the progression of steps for fabricating a non-volatile memory in accordance with another embodiment of the present invention.

In addition, in another embodiment of the invention, the anti-reflection layer 110a is formed from an organic material. In this manner, after the stacked structure 113 (such as FIG. 1B) is patterned, the photoresist layer is removed to expose the control gate 105a, as shown in FIG. 2A. Here, since the anti-reflection layer is formed by organic material, during removing the photoresist layer 112, the anti-reflection layer 110a is removed at the same time. Then, the exposed surface of the control gate 105a is formed with a thin oxide layer 119a, wherein the thin oxide layer is formed, for example, on top and side walls of the control gate 105a. The thin oxide layer 119a is used to protect the control gate 105a from being damaged from subsequent fabrication processes. The thin oxide layer 119a is similar to the thin oxide layer 119 in material and fabrication method.

And, the like numerals represent the like elements. The material and the fabrication method are similar to the previous embodiment without further descriptions.

Figure 2B:
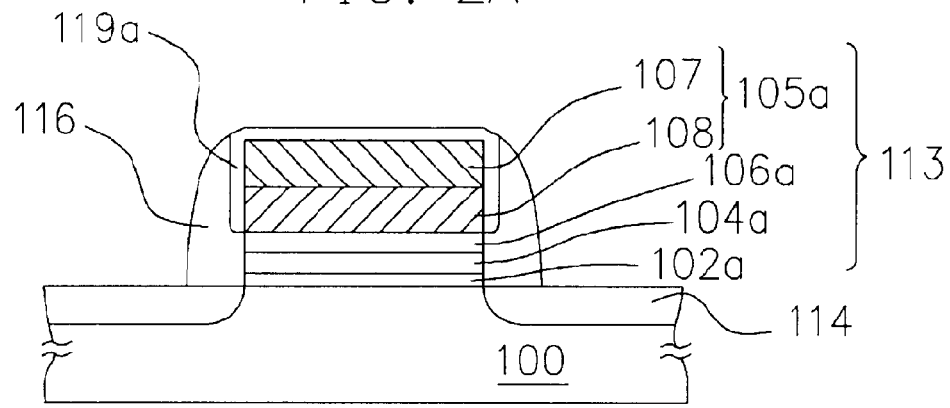

In FIG. 2B, the source/drain region 114 is formed in the substrate 100 at each side of the stacked structure 113. An insulating spacer 116 is formed on the sidewalls of the stacked structure 113 and covers the thin oxide layer 119a on the sidewalls of the control gate 105a.

Figure 2C:
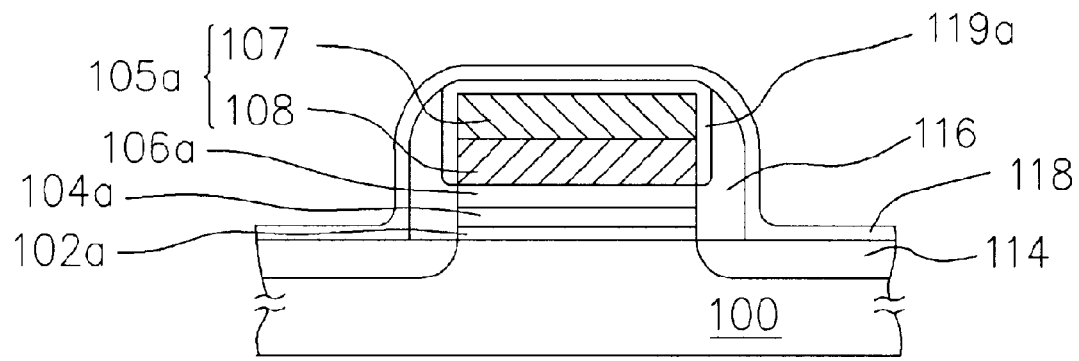
Figure 2D:
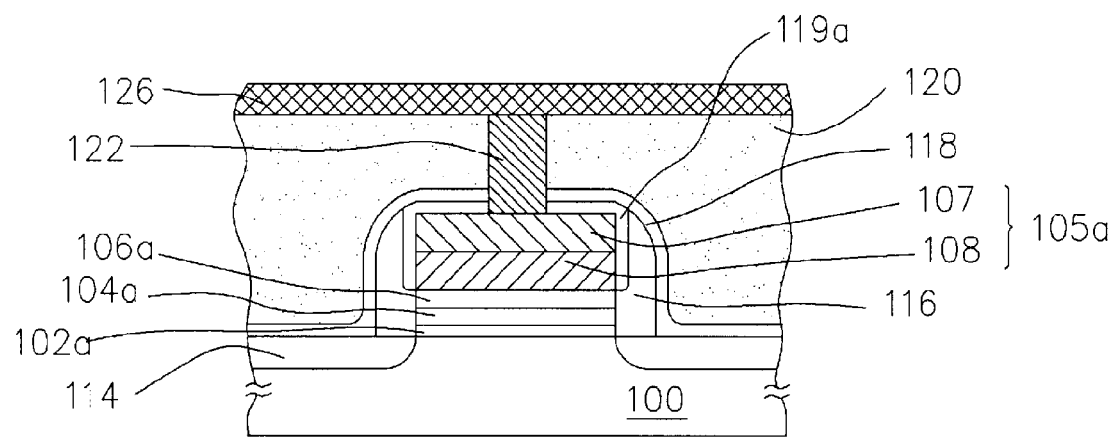

In FIG. 2C, a PECVD process is performed to form an ultraviolet-resistant lining layer 118 over the spacer 116 and the substrate 100. In FIG. 2D, an inter-layer dielectric layer 120 is formed on the ultraviolet-resistant lining layer 118. A contact window 122 is formed in the inter-layer dielectric layer 120 and penetrates the ultraviolet-resistant lining layer 118 and the thin oxide layer 119a on the control gate 105a. Then, a metal layer 126 is formed on the dielectric layer 120 and the contact window 122.

Figure 2E:
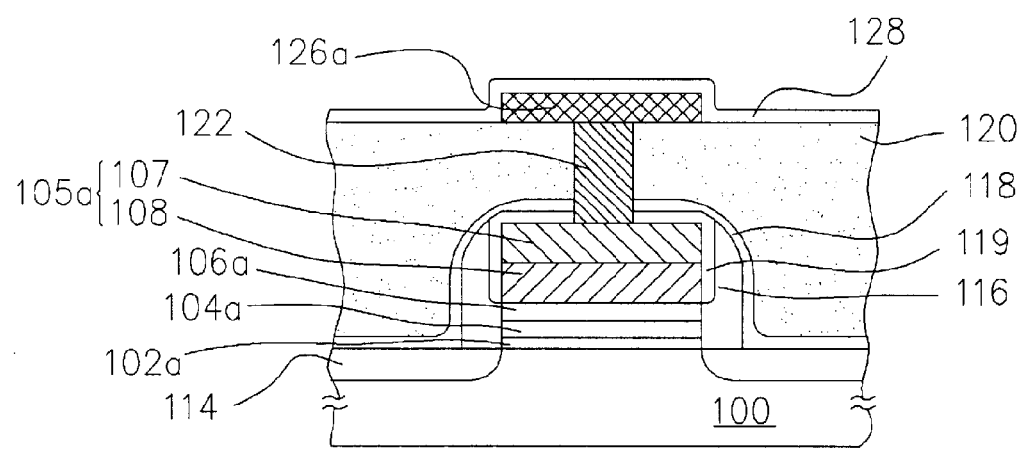

In FIG. 2E, the metal layer 126 is patterned by photolithographic and etching processes to form, for example, a patterned conductive structure 126a. The conductive structures 126a is electrically coupled to the control gate 105a by the control window 122. A PECVD process is performed to form a lining layer 128 with low surface charges on the conductive structures 126a and the dielectric layer 120.

Figure 3A:
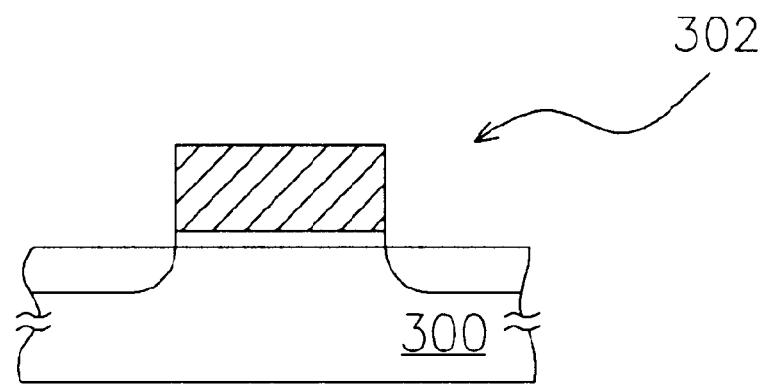
FIGS. 3A–3D are cross-sectional views showing the progression of steps for fabricating the metal interconnect process in accordance with the present invention.
Figure 3B:
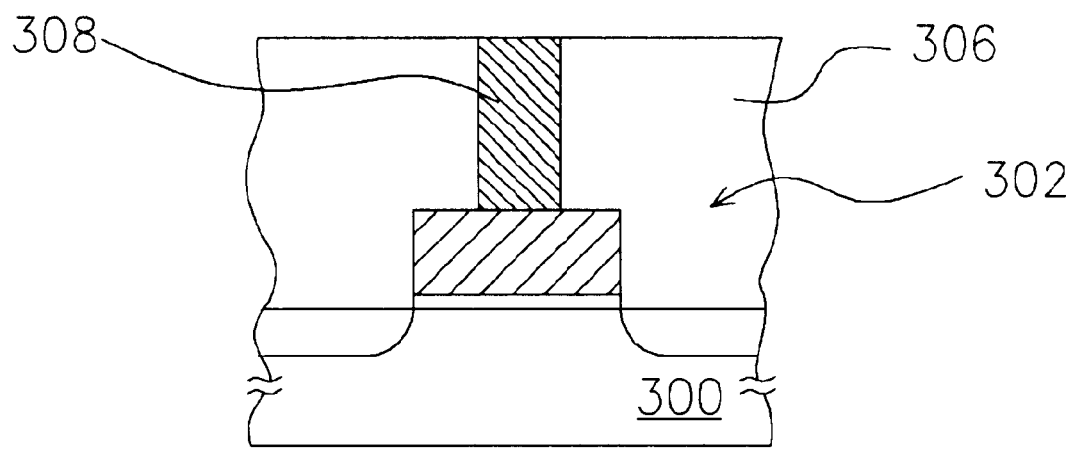
Figure 3C:
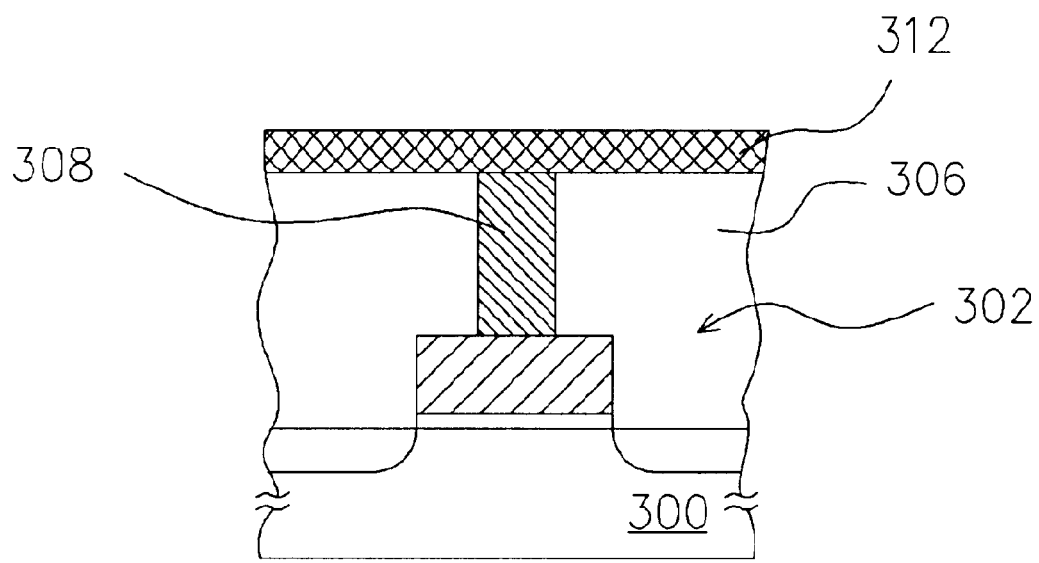

The application of the metal interconnect process in the above embodiment is not limited to the non-volatile memory. It also can be applied to other metal interconnect process. Another embodiment of the present invention is described as follows. Referring to FIG. 3A, a substrate 300 is provided; the substrate 300 includes a conducting structure 302, such as, a MOS transistor. Referring to FIG. 3B, a dielectric layer 306 is formed on the surface of the substrate 300 and the conducting structure 302. Then, a contact 308 is formed in the dielectric layer 306. Referring to FIG. 3C, a metal layer 312 is then formed on the top surfaces of the dielectric layer 306 and the contract 308.

Figure 3D:
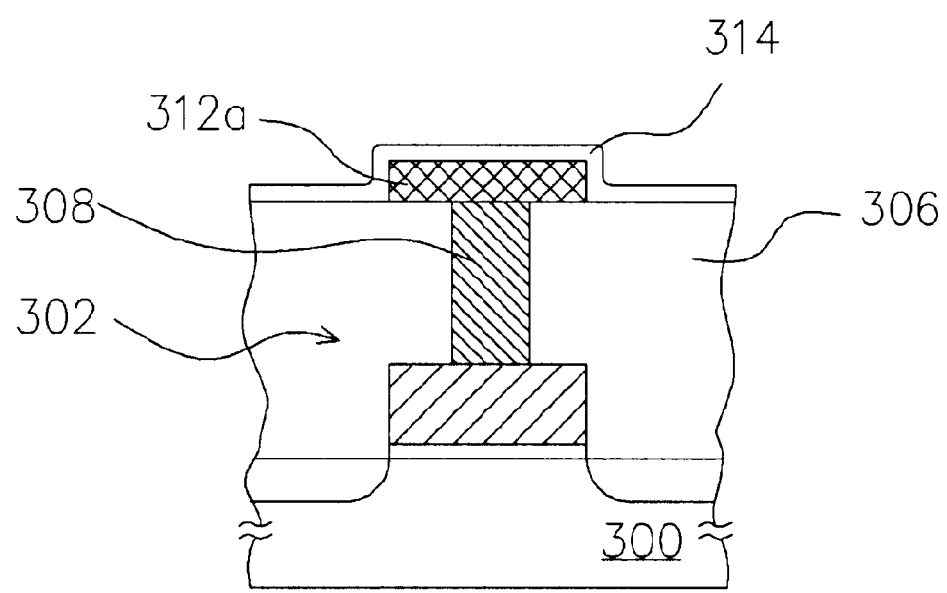

Referring to FIG. 3D, an etching process is performed to pattern the metal layer 312 thereby forming a conducting line structure 312a electrically connected to the contact window. Then, the PECVD process is performed to form a low surface charge lining layer 314 on the surfaces of the conducting line structure 312a and the dielectric layer 306. The material of the low surface charge lining layer 314 can be silicon oxide or silicon nitride. Taking silicon oxide as an example, the process parameters for forming the low surface charge lining layer 314 are as follow. The reacting gas includes $SiH_4$ with a flow rate between 20 sccm and 30 sccm, preferably 25 sccm, and $N_2O$ with a flow rate between 350 sccm and 1000 sccm, preferably 900 sccm. The temperature for the PECVD process is between 380° C. and 420° C., preferably 400° C. The power for the PECVD process is between 370W and 410W, preferably 390W. The pressure for PECVD is between 2.0 torr and 3.0 torr, preferably 2.5 torr. The thickness of the film is between 900 Å and 3300 Å, preferably 2000 Å.

In brief, the present invention uses a PECVD process, which is conducted with a lower power and a low deposition rate to form a denser and a lower surface charge lining layer to thereby mitigate the antenna effect. Further, the present invention uses a PECVD process, which is conducted with a lower power and a low deposition rate to form the ultraviolet-resistant lining layer to prevent the ultraviolet light from penetrating into the trapping layer and to prevent the unwanted charges from being trapped by the trapping layer. Because the method for fabricating a non-volatile memory and the metal interconnect process of the present invention are very simple, the objects of the present invention can be achieved without further complicating the process.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A method for fabricating a non-volatile memory, comprising:
    providing a substrate with a stacked structure having a control gate, a barrier layer, a trapping layer, and a tunneling layer, wherein an anti-reflection layer covers the stacked structure on top;
    forming an oxide layer on an exposed surface of the of the control gate;
    forming an insulating spacer on a sidewall of the stacked structure, and covering the oxide layer; and
    performing a plasma enhanced chemical vapor deposition process to form an ultraviolet-resistant lining layer over the surface of the stacked structure, wherein the ultraviolet-resistant lining layer can effectively resist ultraviolet light.

2. The method of claim 1, wherein the insulating spacer is a silicon oxide spacer.

3. The method of claim 1, wherein the ultraviolet-resistant lining layer is a silicon nitride lining layer.

4. The method of claim 3, wherein the step of forming the silicon nitride lining layer further comprises performing a plasma enhanced chemical vapor deposition (PECVD) process with a power between 370W and 410W, using a reacting gas including a $SiH_4$ gas with a flow rate between 50 sccm and 60 sccm, ammonia ($NH_2$) gas and a nitrogen ($N_2$) gas.

5. The method of claim 1, wherein the anti-reflection layer includes inorganic material, and the anti-reflection layer serves to protect the control gate.

6. The method of claim 1, wherein the anti-reflection layer includes organic material, and the anti-reflection layer is subsequently removed.

7. The method of claim 1, wherein the oxide layer is formed by performing a thermal oxidation process.

8. The method of claim 1, further forming a source/drain region in the substrate at each side of the stacked structure.

9. A fabrication process for metal interconnects, comprising:
    providing a substrate, the substrate having a conducting structure;
    forming a dielectric layer on the substrate to cover the conducting structure;
    forming a contact window in the dielectric layer, the contact window being electrically connected to the conducting structure;
    forming a conducting line structure on the dielectric layer, the conducting line structure being electrically connected to the contact window; and
    performing a plasma enhanced chemical vapor disposition process to form a low surface charge lining layer for covering the conducting line structure, wherein the low surface charge lining layer can effectively resist ultraviolet light.

10. The method of claim 9, wherein the low surface charge lining layer is one of a silicon oxide lining layer and a silicon nitride lining layer.

11. The method of claim 10, wherein the step of forming the silicon oxide lining layer further comprises performing a plasma enhanced chemical vapor deposition (PECVD) process with power between 80W and 120W, a reacting gas including a silane ($SiH_4$) gas with a flow rate between 20 sccm and 30 sccm, and nitrous ($N_2O$) gas.

12. The method of claim 9, further comprising forming a second dielectric layer on the low surface charge lining layer.

13. A method for fabricating a non-volatile memory, comprising:

sequentially forming a tunneling layer, a trapping layer, a barrier layer, a gate conductive layer, and an anti-reflection layer on a substrate;

forming a patterned photoresist layer on the anti-reflection layer;

using the patternred photoresist layer as a mask to etch the anti-reflection layer, the gate conductive layer, the barrier layer, the trapping layer, and the tunneling layer, to form a stacked structure having a control gate, the barrier layer, the trapping layer, and the tunneling layer, wherein the anti-reflection layer covers the stacked structure;

removing the patterned photoresist layer;

forming an oxide layer on an exposed surface of the control gate;

forming a source/drain region in the substrate at each side of the stacked structure;

performing a plasma enhanced chemical vapor deposition process to form an ultraviolet-resistant lining layer over the stacked structure, wherein the ultraviolet-resistant lining layer can effectively resist ultraviolet light;

forming a dielectric layer on the ultraviolet-resistant lining layer;

forming a contact window in the dielectric layer, the contact window being electrically connected to the control gate;

forming a conducting line structure on the dielectric layer, the conducting line structure being electrically connected to the contact window; and forming a low-surface-charge lining layer over the dielectric layer and the conducting line structure.

14. The method of claim 13, further comprising a step of forming an insulating spacer covering the oxide layer, wherein the insulating spacer is a silicon oxide spacer.

15. The method of claim 13, wherein the ultraviolet-resistant lining layer is a silicon nitride lining layer.

16. The method of claim 15, wherein the step of forming the silicon nitride lining layer further comprises performing a plasma enhanced chemical vapor deposition (PECVD) process with a power between 370W and 410W, using a reacting gas including a silane ($SiH_4$) gas with a flow rate between 50 sccm and 60 sccm, ammonia ($NH_3$) gas and nitrogen ($N_2$) gas.

17. The method of claim 13, wherein the low-surface-charge lining layers is one of a silicon oxide lining and a silicon nitride lining layer.

18. The method of claim 17, wherein the step of forming the silicon oxide lining layer further comprises performing a plasma enhanced chemical vapor deposition (PECVD) process with a power between 80W and 120W, using a reacting gas including a $SiH_4$ gas with a flow rate between 20 sccm and 30 sccm, and an $NO_2$ gas.

19. The method of claim 13, wherein the anti-reflection layer includes inorganic material, and the anti-reflection layer is retained to protect the control gate.

20. The method of claim 13, wherein the anti-reflection layer includes organic material, and the anti-reflection layer is removed simultaneously during the step of removing the patterned photoresist layer and the oxide layer.

21. The method of claim 13, wherein the oxide layer is formed by performing a thermal oxidation process.

22. The method of claim 13, further comprising forming a second dielectric layer on the low-surface-charge lining layer.

* * * * *

UNITED STATES PATENT AND TRADEMARK OFFICE
CERTIFICATE OF CORRECTION

PATENT NO. : 6,881,619 B1
DATED : April 19, 2005
INVENTOR(S) : Lee et al.

It is certified that error appears in the above-identified patent and that said Letters Patent is hereby corrected as shown below:

Column 6,
Lines 4-5, change "370W and 410W, preferably 390W" to -- 80W and 120W --;

Column 7,
Line 41, change "370W and 410W, preferably 390W" to -- 80W and 120W --.

Signed and Sealed this

Eighth Day of November, 2005

JON W. DUDAS
*Director of the United States Patent and Trademark Office*